(12) United States Patent
Ozaki et al.

(10) Patent No.: US 9,660,065 B2
(45) Date of Patent: May 23, 2017

(54) SEMICONDUCTOR DEVICE AND METHOD FOR PRODUCING SAME HAVING MULTILAYER WIRING STRUCTURE WITH CONTACT HOLE HAVING HYDROPHOBIC FILM FORMED ON SIDE SURFACE OF THE CONTACT HOLE

(71) Applicant: FUJITSU LIMITED, Kawasaki-shi, Kanagawa (JP)

(72) Inventors: Shirou Ozaki, Yamato (JP); Naoya Okamoto, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 24 days.

(21) Appl. No.: 14/513,607

(22) Filed: Oct. 14, 2014

(65) Prior Publication Data

US 2015/0115411 A1    Apr. 30, 2015

(30) Foreign Application Priority Data

Oct. 31, 2013  (JP) .................................. 2013-227148

(51) Int. Cl.
*H01L 23/544*  (2006.01)
*H01L 29/778*  (2006.01)
(Continued)

(52) U.S. Cl.
CPC ...... *H01L 29/7786* (2013.01); *H01L 21/0217* (2013.01); *H01L 21/02063* (2013.01);
(Continued)

(58) Field of Classification Search
CPC ............. H01L 29/7786; H01L 21/3105; H01L 23/296; H01L 29/66462; H01L 21/78;
(Continued)

(56) References Cited

U.S. PATENT DOCUMENTS 6,465,872 B2 * 10/2002 Tada ....................... H01L 21/78
                                                             257/620
7,244,673 B2 *  7/2007 Huang .............. H01L 23/53295
                                                             257/758
(Continued)

FOREIGN PATENT DOCUMENTS

JP       S63-152673 A    6/1988
JP     2002-359256 A1   12/2002
(Continued)

OTHER PUBLICATIONS

S. Nogueira et al.; "Production of highly hydrophobic films using low frequency and high density plasma"; Revista Brasileria de Aplicacoes de Vacuo; vol. 25, No. 1; 45-53 pp; 2006.*

(Continued)

*Primary Examiner* — Stephen W Smoot
*Assistant Examiner* — Vicki B Booker
(74) *Attorney, Agent, or Firm* — Kratz, Quintos & Hanson, LLP

(57) ABSTRACT

A method of producing a semiconductor device includes forming an insulating film on a substrate on which a semiconductor layer is formed; removing a part of the insulating film by etching to form an opening in the insulating film; supplying steam with a temperature greater than or equal to 200° C. and less than or equal to 600° C. to the opening formed in the insulating film; after supplying the steam, applying a solution including a silicon compound to a side surface or the insulating film defining the opening; and forming a hydrophobic film on the side surface of the insulating film defining the opening by polymerizing the silicon compound.

4 Claims, 15 Drawing Sheets

(51) Int. Cl.
*H01L 29/66* (2006.01)
*H01L 23/29* (2006.01)
*H01L 21/02* (2006.01)
*H01L 21/78* (2006.01)
*H01L 21/3105* (2006.01)
*H01L 21/768* (2006.01)
*H01L 29/20* (2006.01)
*H01L 27/06* (2006.01)
*H01L 23/31* (2006.01)

(52) U.S. Cl.
CPC .. *H01L 21/02167* (2013.01); *H01L 21/02216* (2013.01); *H01L 21/02219* (2013.01); *H01L 21/02282* (2013.01); *H01L 21/02312* (2013.01); *H01L 21/3105* (2013.01); *H01L 21/76814* (2013.01); *H01L 21/76825* (2013.01); *H01L 21/76826* (2013.01); *H01L 21/76832* (2013.01); *H01L 21/78* (2013.01); *H01L 23/296* (2013.01); *H01L 29/66462* (2013.01); *H01L 23/3157* (2013.01); *H01L 23/3192* (2013.01); *H01L 27/0629* (2013.01); *H01L 29/2003* (2013.01); *H01L 2924/0002* (2013.01)

(58) Field of Classification Search
CPC ......... H01L 21/76814; H01L 21/76825; H01L 21/76826; H01L 21/76832; H01L 21/02063; H01L 21/02167; H01L 21/0217; H01L 21/02216; H01L 21/02219; H01L 21/02282; H01L 21/02312
See application file for complete search history.

(56) References Cited

U.S. PATENT DOCUMENTS

| | | | |
|---|---|---|---|
| 2002/0156180 A1* | 10/2002 | Yamada | C09D 183/04 524/588 |
| 2005/0017365 A1* | 1/2005 | RamachandraRao | H01L 21/76808 257/758 |
| 2005/0079705 A1 | 4/2005 | Takeuchi | |
| 2009/0061633 A1 | 3/2009 | Nakata | |
| 2010/0301494 A1 | 12/2010 | Schaller et al. | |
| 2010/0320618 A1 | 12/2010 | Ozaki et al. | |
| 2011/0003402 A1 | 1/2011 | Chakrapani et al. | |
| 2012/0325920 A1 | 12/2012 | Ozaki et al. | |
| 2015/0135472 A1 | 5/2015 | Ozaki et al. | |

FOREIGN PATENT DOCUMENTS

| | | |
|---|---|---|
| JP | 2003-282698 A1 | 10/2003 |
| JP | 2006-203060 A | 8/2006 |
| JP | 2009-76855 A1 | 4/2009 |
| JP | 2010-010489 A | 1/2010 |
| WO | 2009/118805 A1 | 10/2009 |
| WO | 2011/161797 A1 | 12/2011 |
| WO | 2012/148641 A2 | 11/2012 |

OTHER PUBLICATIONS

Japanese Patent Application No. 2013-227148: Notification of Reasons for Refusal mailed Mar. 21, 2017.

* cited by examiner

SEMICONDUCTOR DEVICE AND METHOD FOR PRODUCING SAME HAVING MULTILAYER WIRING STRUCTURE WITH CONTACT HOLE HAVING HYDROPHOBIC FILM FORMED ON SIDE SURFACE OF THE CONTACT HOLE

CROSS-REFERENCE TO RELATED APPLICATION

This application is based upon and claims the benefit of priority of Japanese Patent Application No. 2013-227148 filed on Oct. 31, 2013, the entire contents of which are incorporated herein by reference.

FIELD

An aspect of this disclosure relates to a semiconductor device and a method for producing the semiconductor device.

BACKGROUND

Nitride semiconductors such as GaN, AlN, and InN and a material made of a mixed crystal of two or more of the nitride semiconductors have a wide band gap and are used, for example, for high-power electronic devices and short-wavelength light-emitting devices. For example, GaN, which is a nitride semiconductor, has a band gap of 3.4 eV that is greater than the band gap 1.1 eV of Si and the band gap 1.4 eV of GaAs.

An example of a high-power electronic device is a field effect transistor (FET), particularly, a high electron mobility transistor (HEMT) (see, for example, Japanese Laid-Open Patent Publication No. 2002-359256). A HEMT including a nitride semiconductor is used, for example, for a high-power, high-efficiency amplifier and a high-power switching device. For example, there exists a HEMT including an electron supply layer made of AlGaN and an electron transit layer made of GaN. In this HEMT, piezoelectric polarization occurs in AlGaN due to a lattice constant difference between AlGaN and GaN and as a result, a highly-concentrated two-dimensional electron gas (2DEG) is generated. For this reason, the HEMT can operate at a high voltage, and can be used, for example, for a high-efficiency switching device and a high-voltage electric device for an electric vehicle.

Also, because a HEMT has excellent high-speed characteristics, its use for a signal processing circuit of an optical communication system and other high-speed digital circuits is being considered. Particularly, due to its low-noise characteristics, there is a demand to use a HEMT for an amplifier in a microwave band or a millimeter wave band. When an amplifier is used in a millimeter wave band, a high current-gain cutoff frequency (fT) is required to achieve a sufficient amplifier gain. For this purpose, it is necessary to improve a mutual conductance (gm) that is a parameter related to an amplification factor of a transistor as well as to reduce the gate-source capacitance by reducing the gate length. Also, when a semiconductor device is implemented as a monolithic microwave integrated circuit (MMIC) to reduce its module size, a parasitic capacitance is generated by an interlayer insulating film between wiring layers and therefore it is desired to reduce the dielectric constant of the interlayer insulating film. For this reason, in a semiconductor device such as an MMIC having a multilayer wiring structure, benzocyclobutene (BCB) or polysilazane is used, for example, to form a low-dielectric-constant insulating film implementing an interlayer insulating film.

A low-dielectric-constant insulating film used as an interlayer insulating film has a low film density and therefore has a low water resistance compared with an insulating film that is formed with, for example, $SiO_2$ or SiN by a general film forming method. For this reason, in a semiconductor device such as an MMIC having a multilayer wiring structure, atmospheric moisture may penetrate through a low-dielectric-constant insulating film and oxidize metal that forms wiring. To prevent the penetration of moisture, a protective film is formed on an exposed part of the low-dielectric-constant insulating film (see, for example, Japanese Laid-Open Patent Publication No. 2003-282698 and Japanese Laid-Open Patent Publication No. 2009-76855). However, a protective film formed by a related-art method may not sufficiently prevent the penetration of moisture. When metal that forms wiring is oxidized, it causes a short circuit between wires, increases contact resistance, and reduces electric characteristics. Thus, penetration of moisture reduces the reliability and life of a semiconductor device.

SUMMARY

According to an aspect of the embodiments of the invention, there is provided a method of producing a semiconductor device. The method includes forming an insulating film on a substrate on which a semiconductor layer is formed; removing a part of the insulating film by etching to form an opening in the insulating film; supplying steam with a temperature greater than or equal to 200° C. and less than or equal to 600° C. to the opening formed in the insulating film; after supplying the steam, applying a solution including a silicon compound to a side surface of the insulating film defining the opening; and forming a hydrophobic film on the side surface of the insulating film defining the opening by polymerizing the silicon compound.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
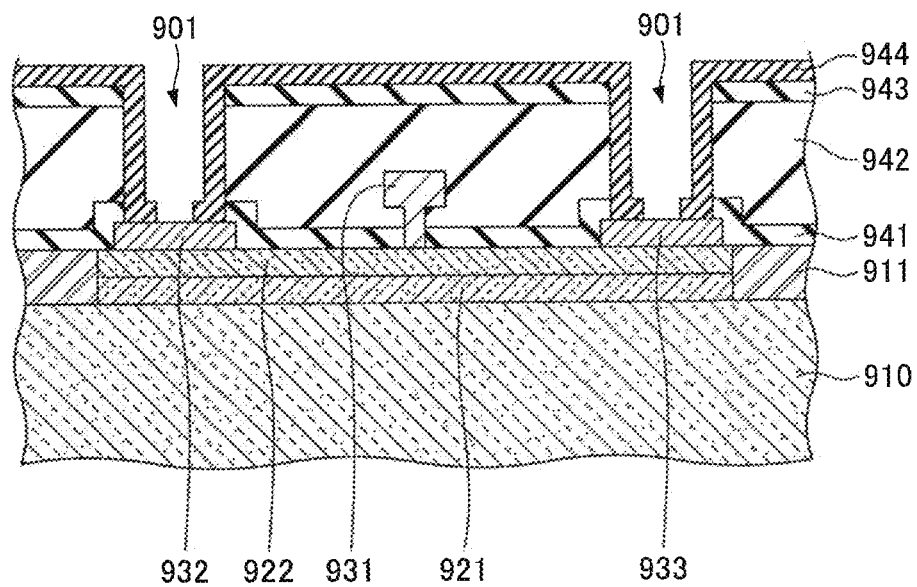
FIG. 1 is a drawing illustrating contact holes formed in a semiconductor device.

FIG. 1 is a drawing illustrating contact holes 901 formed in a semiconductor device having a multilayer wiring structure. The semiconductor device includes a substrate 910; an electron transit layer 921 and an electron supply layer 922 formed on the substrate 910 using a nitride semiconductor; and a gate electrode 931, a source electrode 932, and a drain electrode 933 formed on the electron supply layer 922. On the electron supply layer 922, a lower insulating film 941, an interlayer insulating film 942, and an upper insulating film 943 are formed to cover the gate electrode 931, the source electrode 932, and the drain electrode 933. The lower insulating film 941 and the upper insulating film 943 are made of, for example, SiN, and the interlayer insulating film 942 is made of a low-dielectric-constant insulating film with a low film density In areas where the source electrode 932 and the drain electrode 933 are formed, the lower insulating film 941, the interlayer insulating film 942, and the upper insulating film 943 are removed to form openings used as the contact holes 901. The lower insulating film 941 and the upper insulating film 943 are formed by chemical vapor deposition (CVD) of, for example, SiN, and the interlayer insulating film 942 is formed by spin-coating a solution including silica and drying the solution by heating.

As described above, the interlayer insulating film 942 has a low film density and therefore has a low water resistance. For this reason, a protective film 944 made of, for example, SiN is formed to cover side surfaces of the interlayer insulating film 942 exposed in the contact holes 901. After the protective film 944 is formed, the protective film 944 on the source electrode 932 and the drain electrode 933 are removed to expose the surfaces of the source electrode 932 and the drain electrode 933 and thereby enable electric connection through the contact holes 901. Thus, this method complicates a production process.

Also, when the step coverage of the protective film 944 is not good enough, atmospheric moisture enters through the side surfaces of the contact holes 901, i.e., the side surfaces of the interlayer insulating film 942, and oxidizes metal that forms wiring, which results in reduced reliability and life of the semiconductor device. That is, because the step coverage of the protective film 944 formed by a general film forming method such as CVD is not good enough, atmospheric moisture enters through the side surfaces of the contact holes 301 and oxidizes metal that forms wiring and as a result, the reliability and life of the semiconductor device is reduced.

Figure 2:
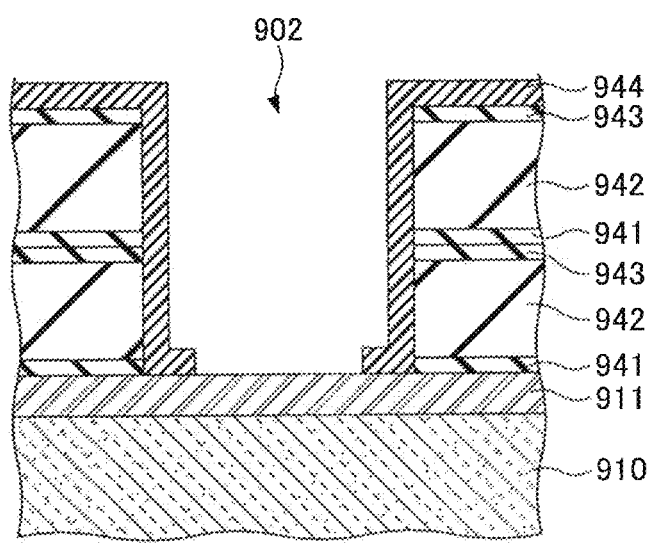
FIG. 2 is a drawing illustrating a scribe line formed in a semiconductor device.

FIG. 2 is a drawing illustrating a scribe line formed in a semiconductor device including an interlayer insulating film. Generally, when producing semiconductor devices, multiple semiconductor elements are formed on a wafer, and the wafer is diced by a dicing saw along scribe lines to separate the wafer into multiple chips.

As illustrated by FIG. 2, a scribe line 902 is formed, for example, by removing insulating films formed on a substrate 910 and thereby forming an opening. In the example of FIG. 2, two layers of interlayer insulating films 942 are formed. More specifically, a device isolation area 911 is formed on the substrate 910, and insulating layers including the two layers of interlayer insulating films 942 are formed on the device isolation area 911. The insulating layers include a first stack of a lower insulating film 941, an interlayer insulating film 942, and an upper insulating film 943 that are stacked on the device isolation area 911; and a second stack of the lower insulating film 941, the interlayer insulating film 942, and the upper insulating film 943 that are stacked on the upper insulating film 943 of the first stack.

The first stack of the lower insulating film 941, the interlayer insulating film 942, and the upper insulating film 943 and the second stack of the lower insulating film 941, the interlayer insulating film 942, and the upper insulating film 943 are removed by, for example, dry etching to form an opening used as the scribe line 902. Because the interlayer insulating films 942 of the first and second stacks have a low film density and a low water resistance, a protective film 944 is formed to cover side surfaces of the interlayer insulating films 942 exposed in the scribe line 902.

However, similarly to the case of the contact holes 901 described above, when the step coverage of the protective film 944 is not good enough, atmospheric moisture enters through the side surfaces of the scribe line 902, i.e., the side surfaces of the interlayer insulating films 942, and oxidizes metal that forms wiring, which results in reduced reliability and life of the semiconductor device.

Here, in the case of the contact holes 901, electrodes are formed by filling the contact holes 901 with a metal material, and the metal material filling the contact holes 901 can prevent entrance of moisture to some extent. On the other hand, the opening forming the scribe line 902 is not filled with, for example, a metal material. Therefore, compared with the case of the contact holes 901, moisture enters more easily through the side surfaces of the scribe line 902.

Thus, for a semiconductor device having a multilayer wiring structure and including an interlayer insulating film made of a low-dielectric-constant insulating film with a low film density, it is desired to form a protective film that can effectively prevent entrance of moisture through the interlayer insulating film and improve the reliability of a semiconductor device.

An aspect of this disclosure makes it possible to effectively prevent entrance of moisture through an interlayer insulating film and improve the reliability of a semiconductor device that has a multilayer wiring structure and includes the interlayer insulating film made of a low-dielectric-constant insulating film with a low film density.

Embodiments of the present invention are described below with reference to the accompanying drawings. The same reference numbers are assigned to the same components throughout the drawings, and repeated descriptions of those components are omitted.

First Embodiment

<Method of Producing Semiconductor Device>

An exemplary method of producing a semiconductor device according to a first embodiment is described below with reference to FIGS. 3 through 10.

Figure 3A:
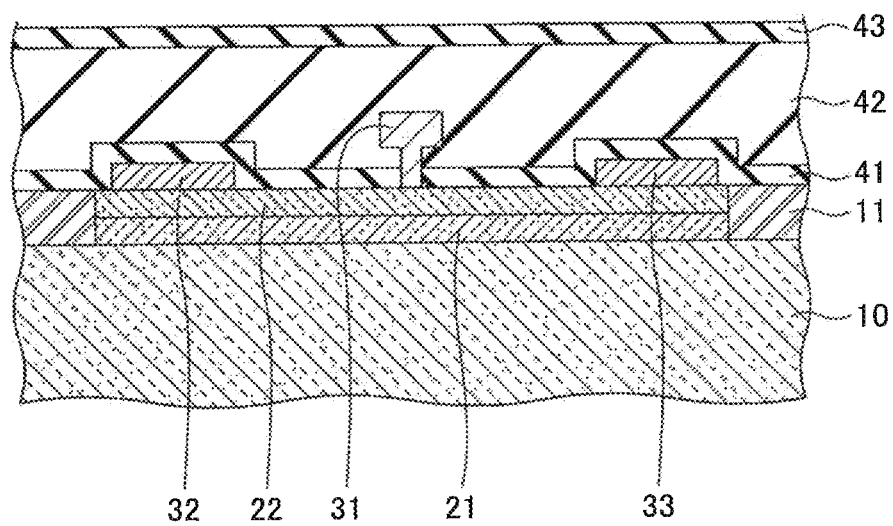
FIGS. 3A and 3B are drawings used to describe a method of producing a semiconductor device according to a first embodiment.

As illustrated by FIG. 3A, nitride semiconductor layers and electrodes are formed on a substrate 10, and a lower insulating film 41, an interlayer insulating film 42, and an upper insulating film 43 are formed to cover the nitride semiconductor layers and the electrodes.

More specifically, as semiconductor layers, an electron transit layer 21 (first semiconductor layer) made of a nitride semiconductor such as GaN and an electron supply layer 22 (second semiconductor layer) made of, for example, AlGaN are formed on an area of the substrate 10 where a HSMT is to be formed. With this configuration, a two-dimensional electron gas (2DEG) (not shown) is generated in the electron transit layer 21 near the interface between the electron transit layer 21 and the electron supply layer 22. The substrate 10 includes, for example, SiC or Si. In the present embodiment, the electron transit layer 21 and the electron supply layer 22 are formed by Metal Organic Vapor Phase Epitaxy (MOVPE). A cap layer (not shown) made of, for example, GaN may be formed on the electron supply layer 22.

Next, a device isolation area 11 is formed on a surface of the substrate 10. More specifically, a photoresist is applied to the electron supply layer 22, and the photoresist is exposed and developed by an exposure apparatus to form a resist pattern (not shown) having an opening in an area where the device isolation area 11 is to be formed. Then, ions such as Ar ions are implanted into the electron supply layer 22 and the electron transit layer 21 in the opening of the resist pattern, to form the device isolation area 11.

Next, a source electrode 32 and a drain electrode 33 are formed on the electron supply layer 22. More specifically, a photoresist is applied to the electron supply layer 22, and the photoresist is exposed and developed by an exposure apparatus to form a resist pattern (not shown) having openings in areas where the source electrode 32 and the drain electrode 33 are to be formed. Here, when a cap layer is formed on the electron supply layer 22, parts of the cap layer in the openings of the resist pattern may be removed by dry etching using a chlorine gas as an etching gas. A metal laminated film of, for example, Ti and Al is formed by vacuum deposition, and the metal laminated film is immersed in an organic solvent to remove, together with the resist pattern, parts of the metal laminated film on the resist pattern by a lift-off technique. The remaining parts of the metal laminated film form the source electrode 32 and the drain electrode 33. Then, neat treatment is performed at a temperature between 400 and 1000° C. in a nitrogen atmosphere to establish ohmic contacts of the source electrode 32 and the drain electrode 33.

Next, the lower insulating film 41 is formed by depositing, for example, SiN by CVD on the electron supply layer 22, the source electrode 32, and the drain electrode 33, and a part of the lower insulating film 41 is removed from an area where a gate electrode 31 is to be formed. Then, the gate electrode 31 is formed on the electron supply layer 22 in the area where the lower insulating film 41 is removed. When a cap layer (not shown) is formed on the electron supply layer 22, the gate electrode 31 may be formed on the cap layer.

More specifically, after the lower insulating film 41 is formed, a photoresist is applied to the lower insulating film 41, and the photoresist is exposed and developed, by an exposure apparatus to form a resist pattern (not shown) having an opening in an area where the gate electrode 31 is no be formed. Then, a part of the lower insulating film 41 is removed, for example, by dry etching from the area where the gate electrode 31 is to be formed, to expose a surface of the electron supply layer 22. When a cap layer (not shown) is formed on the electron supply layer 22, a surface of the cap layer is exposed. After that, a metal laminated film of, for example, Ni and Au is formed by vacuum deposition, and the metal laminated film is immersed in an organic solvent to remove, together with the resist pattern, parts of the metal laminated film on the resist pattern by a lift-off technique. The remaining part of the metal laminated film forms the gate electrode 31.

Next, the interlayer insulating film 42 and the upper insulating film 43 are formed on the lower insulating film 41 and the gate electrode 31. More specifically, a solution including silica is applied by spin-coating to the lower insulating film 41 and the gate electrode 31, and the solution is dried by, for example, heating to form a porous silica film used as the interlayer insulating film 42. The porous silica film or the interlayer insulating film 42 formed as described above has a porosity of about 40% and a relative permittivity of about 2.25. Then, the upper insulating film 43 is formed by depositing, for example, SiN on the interlayer insulating film 42 by CVD.

Figure 3B:
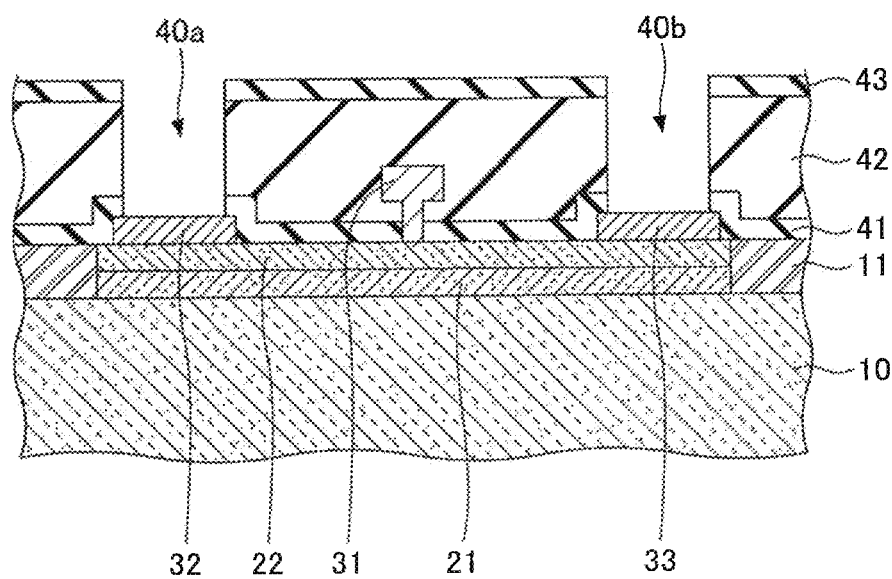

Next, as illustrated by FIG. 3B, parts of the upper insulating film 43, the interlayer insulating film 42, and the lower insulating film 41 in areas corresponding to the source electrode 32 and the drain electrode 33 are removed to form an opening 40a and an opening 40b. As a result, the opening 40a is formed in the area where the source electrode 32 is formed, and the opening 40b is formed in the area where the drain electrode 33 is formed. More specifically, a photoresist is applied to the upper insulating film 43, and the photoresist is exposed and developed by an exposure apparatus to form a resist pattern (not shown) having openings in areas where the openings 40a and 40b are to be formed. Next, parts of the upper insulating film 43, the interlayer insulating film 42, and the lower insulating film 41 in the openings of the resist pattern are removed by dry etching using a fluorine gas as an etching gas, to form the openings 40a and 40b.

Figure 5:
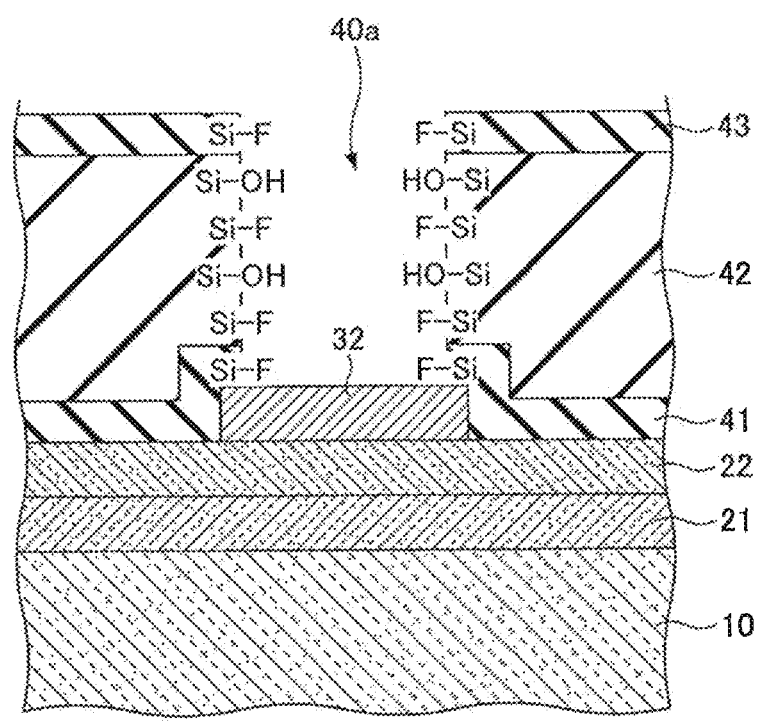
FIG. 5 is a drawing used to describe a method of producing a semiconductor device according to the first embodiment.

As a result, a surface of the source electrode 32 is exposed in the opening 40a, and a surface of the drain electrode 33 is exposed in the opening 40b. At this stage, as illustrated by FIG. 5, Si—F and Si—OH generated by the etching gas adhere to the side surfaces of the openings 40a and 40b. FIG. 5 is an enlarged view of an area in FIG. 33 where the opening 40a is formed. The opening 40b is in a similar condition.

Next, heated water vapor (or steam) is supplied to hydrolyze Si—F adhering to the side surfaces of the openings 40a and 40b. In the present embodiment, this process may be referred to as "steam treatment". More specifically, steam with a temperature of 250° C. is supplied to cause a reaction indicated by Formula (1) below. As a result, Si—F adhering to the side surfaces of the openings 40a and 40b is hydrolyzed by the steam, and Si—OH and HF are generated.

$$Si-F+H_2O \Rightarrow Si-OH+HF \tag{1}$$

Figure 6:
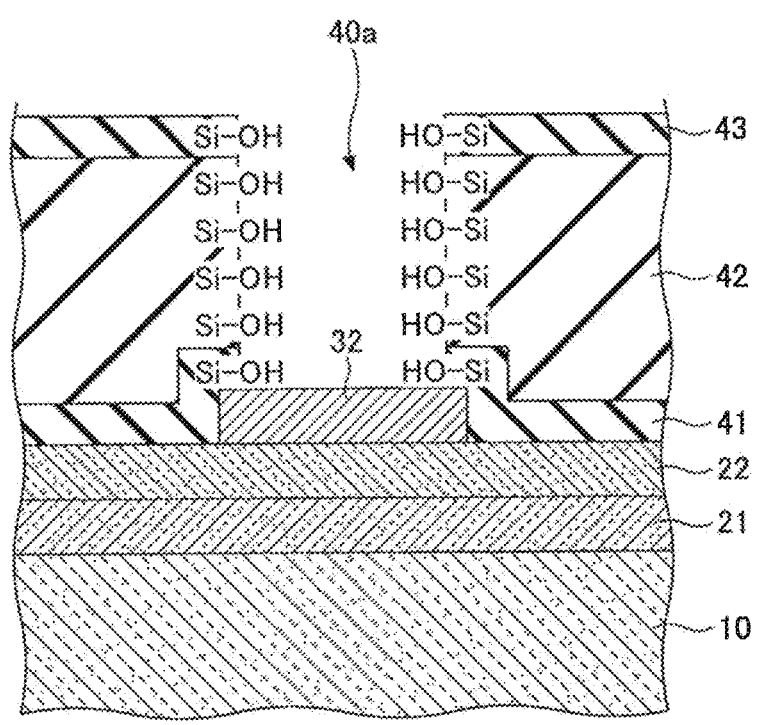
FIG. 6 is a drawing used to describe a method of producing a semiconductor device according to the first embodiment.

That is, when Si—F is hydrolyzed, Si—OH and HF are generated as indicated by Formula (1); and Si—F adhering to the side surface of the opening 40*a* substantially disappears and the amount of Si—OH increases as illustrated by FIG. 6. The same applies to the side surface of the opening 40*b*. The hydrolysis proceeds smoothly when the temperature of steam is greater than or equal to 200° C., but does not proceed or proceeds very slowly when the temperature of steam is less than 200° C. Therefore, using steam with a temperature less than 200° C. is not preferable. Also, using steam with an extremely-high temperature that is greater than, for example, 600° C. is not preferable because such high-temperature steam may adversely affect nitride semiconductors and electrodes. Accordingly, the temperature of steam used for steam treatment in the present embodiment is preferably greater than or equal to 200° C. and less than or equal to 600° C.

Figure 4A:
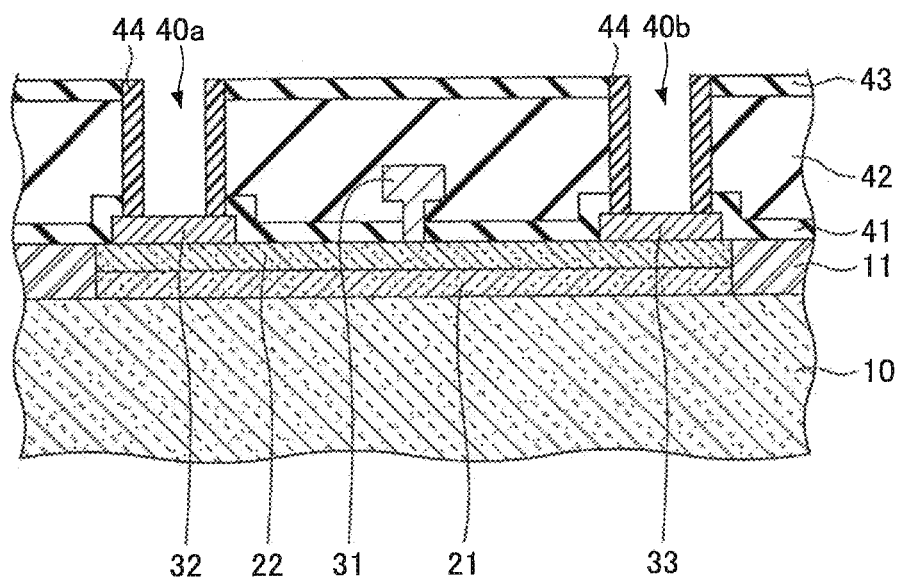
FIGS. 4A and 4B are drawings used to describe a method of producing a semi conductor device according to the first embodiment.
Figure 7:
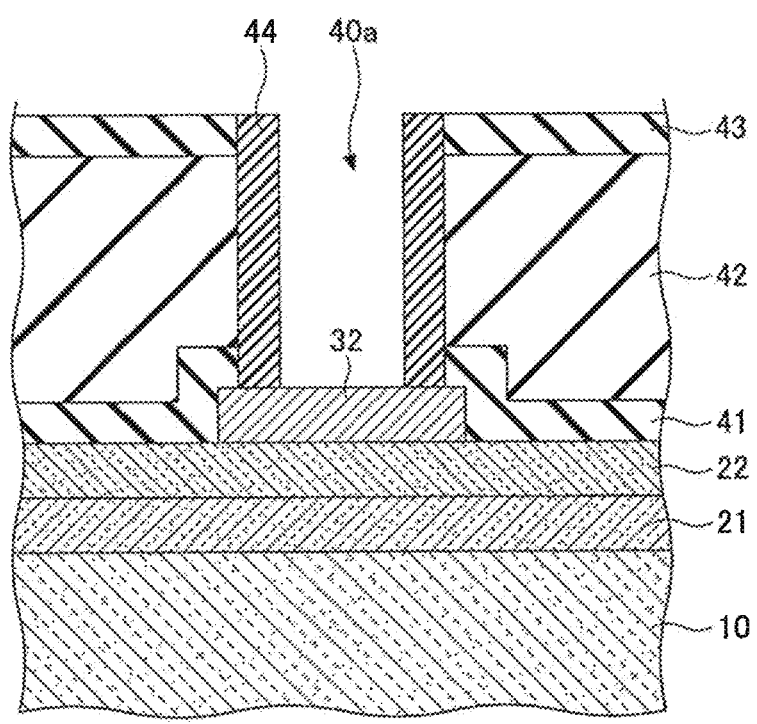
FIG. 7 is a drawing used to describe a method of producing a semiconductor device according to the first embodiment.

Next, as illustrated by FIG. 4A, a solution including vinyltriacetoxysilane is applied by spin coating to the side surfaces of the lower insulating film 41, the interlayer insulating film 42, and the upper insulating film 43 that form the side surfaces of (or defining) the openings 40*a* and 40*b*, and the solution is illuminated by ultraviolet rays to form a hydrophobic film 44 made of a polymerized film including SiC. As a result, the side surfaces of the insulating films including the interlayer insulating film 42, which form the side surfaces of the openings 40*a* and 40*b*, are covered by she hydrophobic film 44. FIG. 7 is an enlarged view of an area in FIG. 4A where the opening 40*a* is formed. Any solution including a silicon compound indicated by Structural Formula (1) below may be used to form the hydrophobic film 44. Also, a polymerized film used as the hydrophobic film 44 may be formed by applying a solution including the silicon compound indicated by structural formula (1) and heating the applied solution to cause polymerization.

Structural Formula (1)

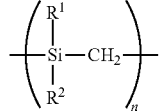

In Structural Formula (1), each of $R^1$ and $R^2$ is one of a hydrogen atom, a substituted or unsubstituted alkyl group, a substituted or unsubstituted alkenyl group, a substituted or unsubstituted cycloalkyl group, and a substituted or unsubstituted aryl group; and "n" is an integer greater than or equal to 2. $R^1$ and $R^2$ may be the same component or different components.

Figure 4B:
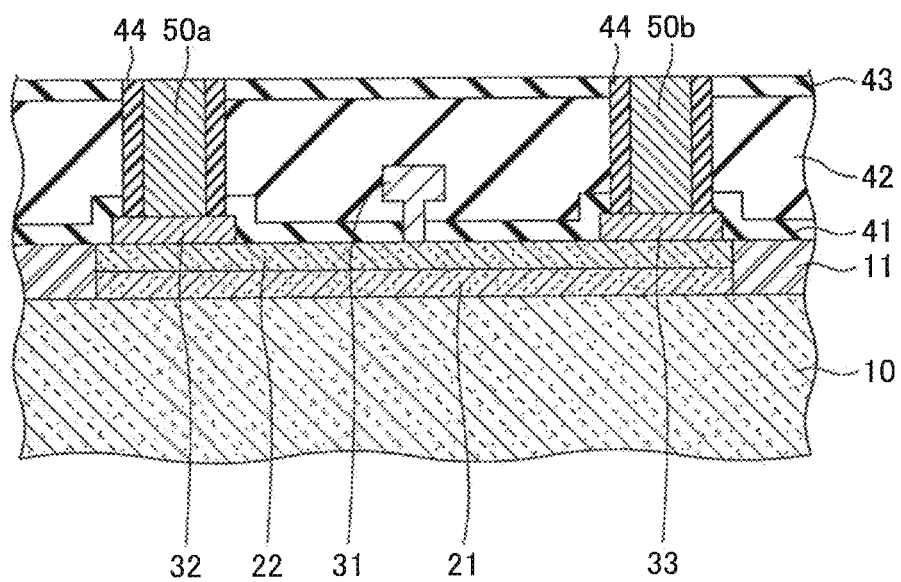

Next, as illustrated by FIG. 4B, the openings 40*a* and 40*b* are filled with a metal material to form through electrodes 50*a* and 50*b*. For example, the through electrodes 50*a* and 50*b* are formed by filling the openings 40*a* and 40*b* with a metal material by CVD or plating. Also, parts of the through electrodes 50*a* and 50*b* may be formed with a metal nitride such as TiN.

After the through electrodes 50*a* and 50*b* are formed, a plated layer is formed with a metal material on each of the through electrodes 50*a* and 50*b*. Then, steps described with reference to FIGS. 3A through 4B are repeated to produce a semiconductor device having a multilayer wiring structure. In the present embodiment, two stacks (or sets) of the lower insulating film 41, the interlayer insulating film 42, and the upper insulating film 43 are formed.

Figure 8A:
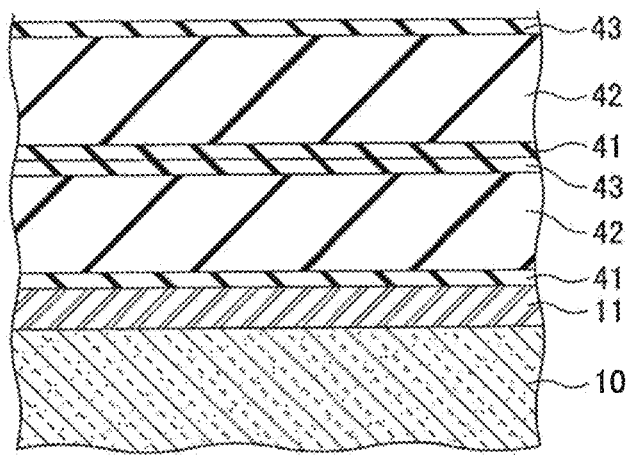
FIGS. 8A and 8B are drawings used to describe a method of producing a semiconductor device according to the first embodiment.
Figure 8B:
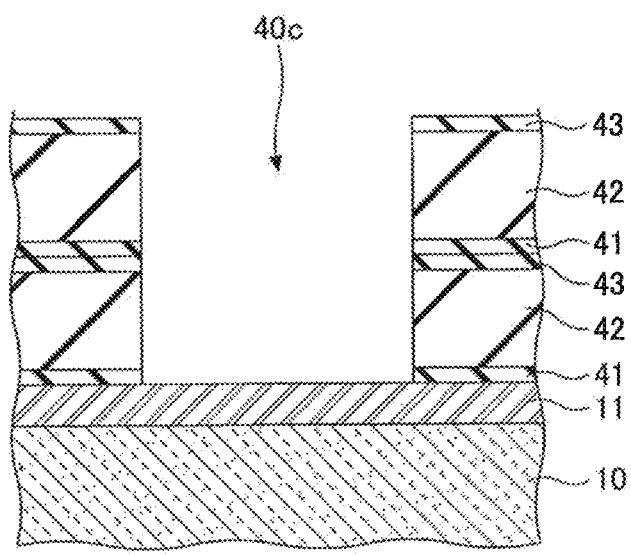

Next, as illustrated by FIGS. 8A and 8B, an opening 40*c* used as a scribe line is formed through the lower insulating films 41, the interlayer insulating films 42, and the upper insulating films 43 formed on the substrate 10. Here, in the area where the opening 40*c* is formed, the device isolation area 11 is formed on the substrate 10, and the insulating films including the two layers of the interlayer insulating films 42 are formed on the device isolation area 11. More specifically, a first stack of the lower insulating film 41, the interlayer insulating film 42, and the upper insulating film 43 and a second stack of the lower insulating film 41, the interlayer insulating film 42, and the upper insulating film 43 are formed on the device isolation area 11 formed on the substrate 10. Accordingly, the opening 40*c* is formed by removing the first stack of the lower insulating film 41, the interlayer insulating film 42, and the upper insulating film 43 and the second stack of the lower insulating film 41, the interlayer insulating film 42, and the upper insulating film 43 from an area where the scribe line is to be formed. The opening 40*c* may be formed by dry etching using a fluorine gas.

Next, heated water vapor (or steam) is supplied to hydrolyze Si—F adhering to the side surfaces of the opening 40*c*. When the opening 40*c* is formed by dry etching, Si—F and Si—OH generated by an etching gas adhere to the side surfaces of the opening 40*c*. Steam with a temperature of 250° C. is supplied to cause a reaction indicated by Formula (1) above. As a result, Si—F adhering to the side surfaces of the opening 40*c* is hydrolyzed by the steam, and Si—OH and HF are generated.

Figure 9:
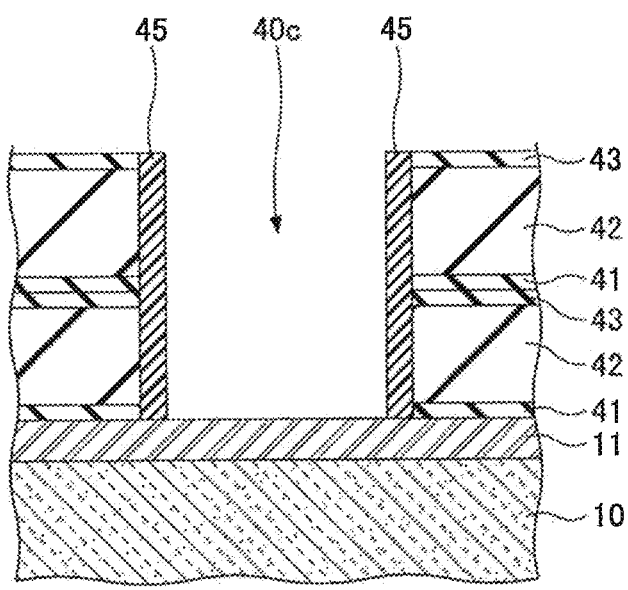
FIG. 9 is a drawing used to describe a method of producing a semiconductor device according to the first embodiment.

Next, as illustrated by FIG. 9, a solution including vinyltriacetoxysilane is applied by spin coating to the side surfaces of the lower insulating film 41, the interlayer insulating film 42, and the upper insulating film 43 that form the side surfaces of (or defining) the opening 40*c*, and the solution is illuminated by ultraviolet rays to form a hydrophobic film 45 made of a polymerized film including SiC. Any solution including a silicon compound indicated by Structural Formula (1) above may be used to form the hydrophobic film 45. Also, a polymerized film used as the hydrophobic film 45 may be formed by applying a solution including the silicon compound indicated by Structural Formula (1) and heating the applied solution to cause polymerization.

Figure 10:
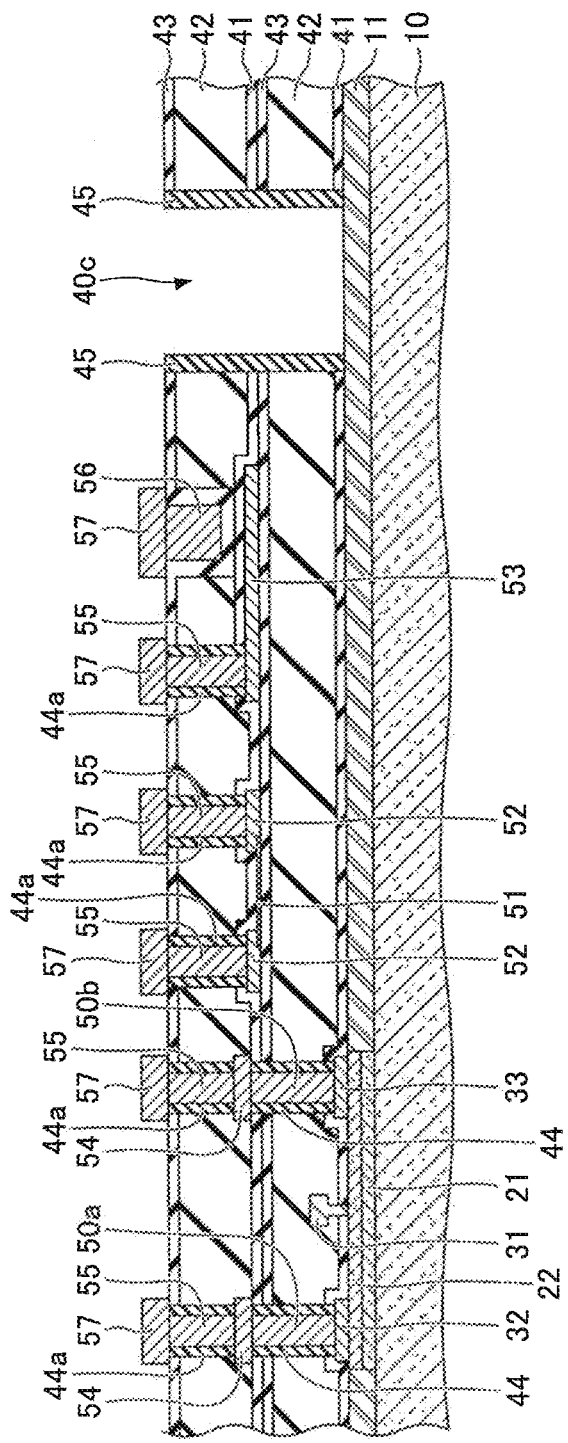
FIG. 10 is a drawing used to describe a method of producing a semiconductor device according to the first embodiment.

FIG. 10 illustrates a structure formed through the above steps, i.e., a structure to be diced by, for example, a dicing saw. As illustrated by FIG. 10, a resistive film 51, two electrode layers 52 contacting the resistive film 51, and an electrode layer 53 are formed on the upper insulating film 43 of the first stack. The resistive film 51 is made of, for example, nichrome and used to implement a resistor. The electrode layer 53 is used to implement a capacitor. Also, first plated layers 54 are formed with a metal material on the through electrodes 50*a* and 50*b*.

Further, through electrodes 55 that pass through the second stack of the lower insulating film 41, the interlayer insulating film 42, and the upper insulating film 43 are formed on the electrode layers 52, the electrode layer 53, and the first plated layers 54, and an electrode 56 used to implement a capacitor is formed above the electrode layer 53. In the present embodiment, a hydrophobic film 44*a*, which is similar to the hydrophobic film 44, is formed around each of the through electrodes 55. More specifically, parts of the second stack of the lower insulating film 41, the interlayer insulating film 42, and the upper insulating film 43 are removed by, for example, dry etching to form openings used as contact holes and thereby expose the surfaces of the electrode layers 52, the electrode layer 53, and the first plated layers 54. Then, after performing hydrolysis by steam treatment, a solution including vinyltriacetoxysilane is applied to the side surfaces of the openings and the solution is illuminated by ultraviolet rays to cause polymerization and form the hydrophobic films 44a on the side surfaces of the openings. The openings, which are used as contact holes and whose side surfaces are covered by the hydrophobic films 44a, are filled with a metal material to form the through electrodes 55.

Also, second plated layers 57 are formed with a metal material on the through electrodes 55 and the electrode 56. The resistor is formed by the resistive film 51 and the two electrode layers 52. The capacitor is formed by the electrode layer 53, the electrode 56, and the lower insulating film 41 and the upper insulating film 43 sandwiched between the electrode layer 53 and the electrode 56. The formed structure is diced into chips by, for example, a dicing saw along scribe lines implemented by openings 40c.

Through the above process, a semiconductor device of the present embodiment is produced. According to the present embodiment, hydrophobic films 44 are formed on the side surfaces of the openings 40a and 40b formed in the insulating films including the interlayer insulating film 42. This configuration makes it possible to prevent moisture from entering through the side surfaces of the openings 40a and 40b formed in the insulating films including the interlayer insulating film 42. Also according to the present embodiment, the hydrophobic film 45 is formed on the side surfaces of the opening 40c (which is used as a scribe line) formed in the insulating films including the interlayer insulating film 42. This configuration makes it possible to prevent moisture from entering through the side surfaces of the opening 40c formed in the insulating films including the interlayer insulating film 42. Thus, the present embodiment makes it possible to prevent entrance of moisture into the interlayer insulating film 42 and thereby makes it possible to improve the reliability and life of a semiconductor device.

<Hydrophobic Film>

Figure 11A:
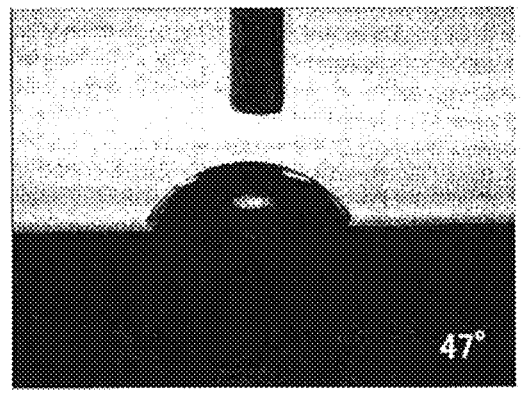
FIGS. 11A through 11C are photographs indicating contact angles of water.
Figure 11B:
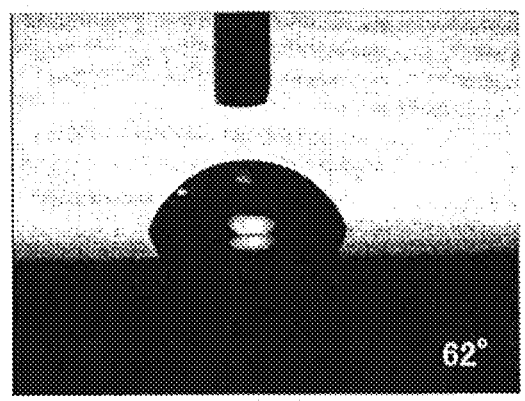
Figure 11C:
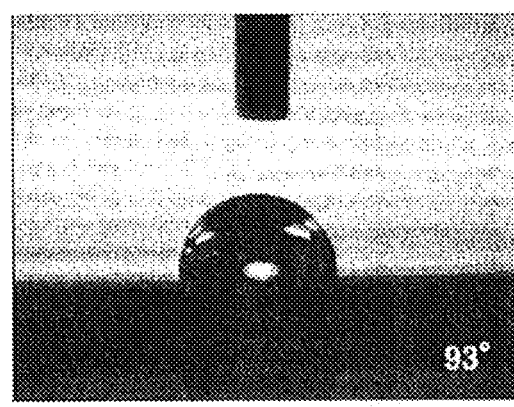

Next, a hydrophobic film formed in a semiconductor device of the present embodiment is described. FIGS. 11A through 11C are photographs indicating contact angles of water dropped on side surfaces of the openings 40a, 40b, and 40c formed in the interlayer insulating film 42.

FIG. 11A is a photograph indicating a contact angle of water dropped on a surface of an opening immediately after the opening is formed by dry etching in a porous silica film implementing the interlayer insulating film 42. In this case, the contact angle of water is 47°. FIG. 11B is a photograph indicating a contact angle of water dropped on a surface of a hydrophobic film formed by applying vinyltriacetoxysilane to a surface of an opening, which is formed by dry etching in a porous silica film implementing the interlayer insulating film 42 and for which hydrolysis with steam is not performed. In this case, the contact angle of water is 62°. FIG. 11C is a photograph indicating a contact angle of water dropped on a surface of the hydrophobic film 44/44a/45 that is formed by a method of the present embodiment. The hydrophobic film 44/44a/45 is formed by applying vinyltriacetoxysilane to a surface of an opening, which is formed by dry etching in a porous silica film implementing the interlayer insulating film 42 and for which hydrolysis has been performed with steam. In this case, the contact angle of water is 93°.

FIG. 11B, in comparison with FIG. 11A, indicates that the contact angle of water can be increased even with a hydrophobic film formed by applying vinyltriacetoxysilane to a surface of an opening that is formed without performing hydrolysis with steam. FIG. 11C indicates that the contact angle of water can be further increased to 90° or higher and water repellency of a hydrophobic film can be drastically improved by performing hydrolysis with steam after etching and before applying vinyltriacetoxysilane. Thus, the present embodiment can drastically improve the water repellency of the hydrophobic film 44/44a/45, effectively preventing atmospheric moisture from entering the interlayer insulating film 42, and improving the reliability of a semiconductor device.

In the present embodiment, as described above, the water repellency of the hydrophobic film 44/44a/45 is improved by performing hydrolysis with steam before applying vinyltriacetoxysilane. Performing hydrolysis with steam converts most Si—F on the side surfaces of the opening 40 (40a, 40b, 40c) into Si—OH and causes Si—F to substantially disappear. Because Si—OH functions as an adsorption site for vinyltriacetoxysilane, a hydrophobic film is formed in an area where Si—OH exists. On the other hand, no hydrophobic film is formed in an area where a large amount of Si—F exists. Accordingly, it is possible to cause vinyltriacetoxysilane to adhere evenly to the side surfaces of the opening 40 by performing hydrolysis with steam and thereby converting Si—F on the side surfaces of the opening 40 into Si—OH. This method makes it possible to form a uniform hydrophobic film 44/44a/45 with improved water repellency on the side surfaces of the opening 40.

Figure 12:
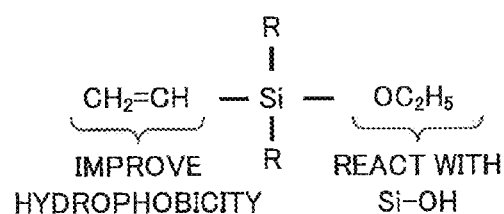
FIG. 12 is a structural formula of vinyltriacetoxysilane.

As illustrated by FIG. 12, an $OC_2H_5$ group of vinyltriacetoxysilane is adsorbed to and reacts with Si—OH. On the other hand, vinyltriacetoxysilane is not adsorbed to an area where Si—OH does not exist and no hydrophobic film is formed in the area. Accordingly, it is possible to form a uniform hydrophobic film 44/44a/45 with excellent water repellency by removing Si—F and increasing the amount of Si—OH on the side surfaces of the opening 40.

Here, because the source electrode 32 and the drain electrode 33 are made of a metal material and have no adsorption site, vinyltriacetoxysilane applied to the surfaces of the source electrode 32 and the drain electrode 33 are repelled and no hydrophobic film is formed on their surfaces. The thickness of the hydrophobic film 44/44a/45 is preferably between several nm and several tens nm. The thickness of the hydrophobic film 44/44a/45 can be adjusted, for example, by adjusting the number of alkoxy groups bonded to silicon of alkoxysilane applied when forming the hydrophobic film 44/44a/45, or by adjusting the number of revolutions of a spin coater used to apply alkoxysilane.

Figure 13:
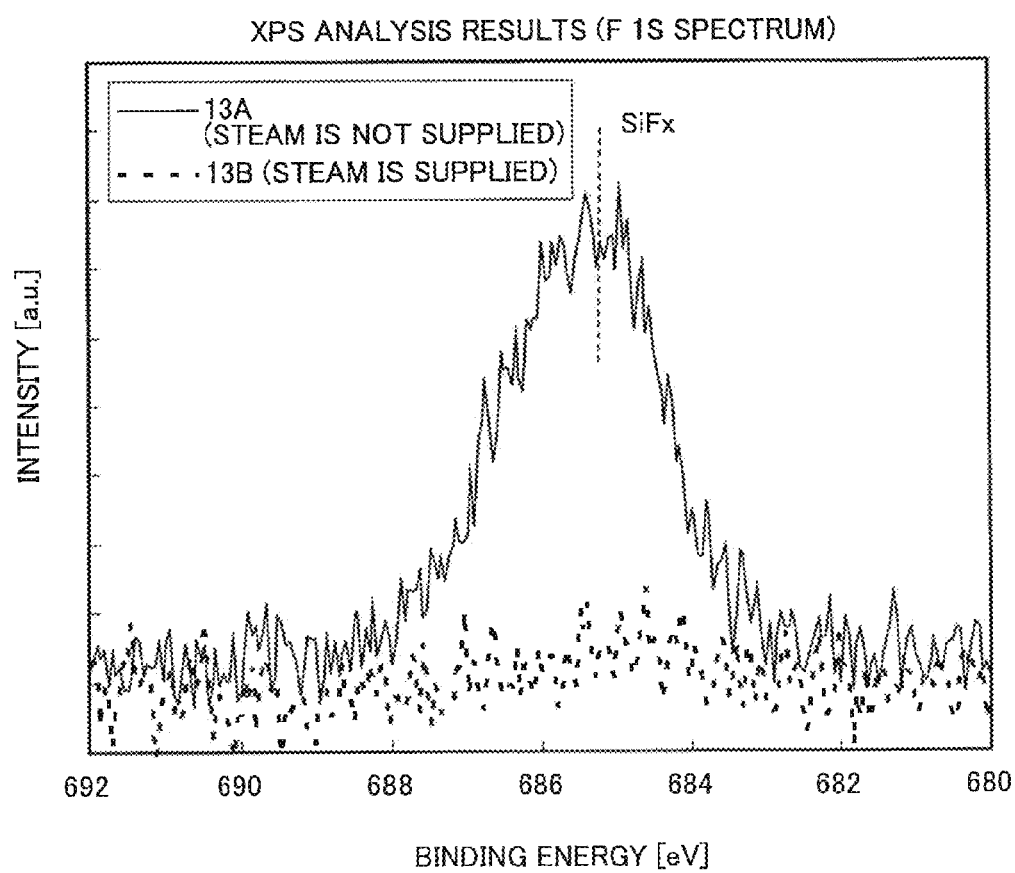
FIG. 13 is a graph illustrating XPS analysis results before and after steam treatment.

FIG. 13 is a graph illustrating measurement results obtained by X-ray photoelectron spectroscopy (XPS). In FIG. 13, "13A" indicates XPS measurement results in a case where steam is not supplied after an opening is formed in the interlayer insulating film 42 by dry etching, and "13B" indicates XPS measurement results in a case where steam is supplied after an opening is formed in the interlayer insulating film 42 by dry etching. While a peak of SiFx is observed in the measurement results of "13A", no peak of SiFx is observed in the measurement results of "13B". This indicates that Si—F is hydrolyzed and converted into Si—OH by the steam, and almost does not exist on the surface of the opening. Thus, performing hydrolysis with steam treatment makes it possible to substantially eliminate Si—F on the side surface of an opening formed by dry etching in the interlayer insulating film 42. This in turn makes it possible to form a uniform hydrophobic film 44/44a/45 with improved water repellency on the side surface of an opening formed in the interlayer insulating film 42, and thereby makes it possible to improve the reliability and life of a semiconductor device.

In the above example, it is assumed that semiconductor layers of a semiconductor device are made of nitride semiconductors such as GaN and AlGaN. However, semiconductor layers of a semiconductor device of the present embodiment may also be made of nitride semiconductors such as GaN and InAlN/InGaAlN. Further, semiconductor layers of a semiconductor device of the present embodiment may be made of compound semiconductors such as GaAs other than nitride semiconductors, or may be made of Si.

Second Embodiment

An exemplary method of producing a semiconductor device according to a second embodiment is described below with reference to FIGS. 14A through 17.

Figure 14A:
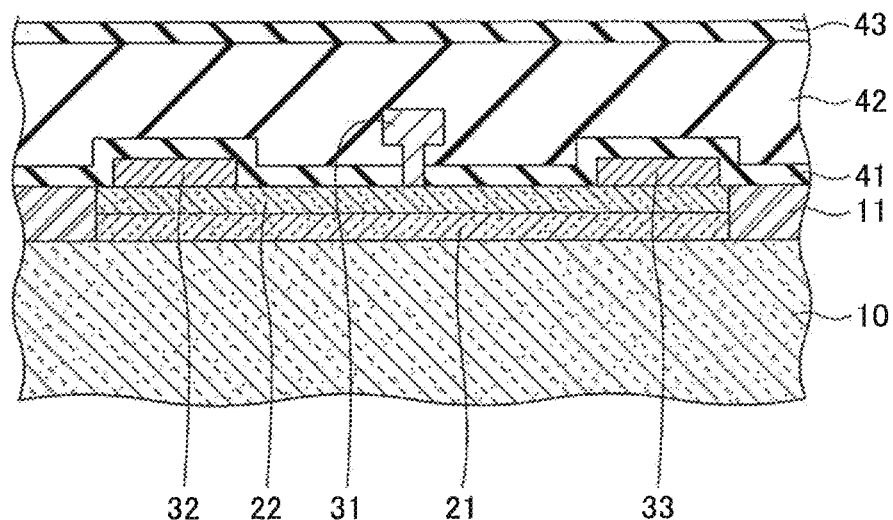
FIGS. 14A and 14B are drawings used to describe a method of producing a semiconductor device according to a second embodiment.

As illustrated by FIG. 14A, nitride semiconductor layers and electrodes are formed on a substrate 10, and a lower insulating film 41, an interlayer insulating film 42, and an upper insulating film 43 are formed to cover the nitride semiconductor layers and the electrodes.

More specifically, as semiconductor layers, an electron transit layer 21 (first semiconductor layer) made of a nitride semiconductor such as GaN and an electron supply layer 22 (second semiconductor layer) made of, for example, AlGaN are formed on an area, of the substrate 10 where a HEMT is to be formed. With this configuration, a two-dimensional electron gas (2DEG) (not shown) is generated in the electron transit layer 21 near the interface between the electron transit layer 21 and the electron supply layer 22. The substrate 10 includes, for example, SiC or Si. In the present embodiment, the electron transit layer 21 and the electron supply layer 22 are formed by Metal Organic Vapor Phase Epitaxy (MOVPE). A cap layer (not shown) made of, for example, GaN may be formed on the electron supply layer 22.

Next, a device isolation area 11 is formed on a surface of the substrate 10. More specifically, a photoresist is applied to the electron supply layer 22, and the photoresist is exposed and developed by an exposure apparatus to form a resist pattern (not shown) having an opening in an area where the device isolation area 11 is to be formed. Then, ions such as Ar ions are implanted into the electron supply layer 22 and the electron transit layer 21 in the opening of the resist pattern to form the device isolation area 11.

Next, a source electrode 32 and a drain electrode 33 are formed on the electron supply layer 22. More specifically, a photoresist is applied to the electron supply layer 22, and the photoresist is exposed and developed by an exposure apparatus to form a resist pattern (not shown) having openings in areas where the source electrode 32 and the drain electrode 33 are to be formed. Here, when a cap layer is formed on the electron supply layer 22, parts of the cap layer in the openings of the resist pattern may be removed by dry etching using a chlorine gas as an etching gas. A metal laminated film made of, for example, Ti and Al is formed by vacuum deposition, and the metal laminated film is immersed in an organic solvent to remove, together with the resist pattern, parts of the metal laminated film on the resist pattern by a lift-off technique. The remaining parts of the metal laminated film form the source electrode 32 and the drain electrode 33. Then, heat treatment is performed at a temperature between 400 and 1000° C. in a nitrogen atmosphere to establish ohmic contacts of the source electrode 32 and the drain electrode 33.

Next, the lower insulating film 41 is formed by depositing, for example, SiN by CVD on the electron supply layer 22, the source electrode 32, and the drain electrode 33, and a part of the lower insulating film 41 is removed from an area where a gate electrode 31 is to be formed. Then, the gate electrode 31 is formed on the electron supply layer 22 in the area where the lower insulating film 41 is removed. When a cap layer (not shown) is formed on the electron supply layer 22, the gate electrode 31 may be formed on the cap layer.

More specifically, after the lower insulating film 41 is formed, a photoresist is applied to the lower insulating film 41, and the photoresist is exposed and developed by an exposure apparatus to form a resist pattern (not shown) having an opening in an area where the gate electrode 31 is to be formed. Then, a part of the lower insulating film 41 is removed, for example, by dry etching from the area where the gate electrode 31 is to be formed, to expose a surface of the electron supply layer 22. When a cap layer (not shown) is formed on the electron supply layer 22, a surface of the cap layer is exposed. After that, a metal laminated film of, for example, Ni and Au is formed by vacuum deposition, and the metal laminated film is immersed in an organic solvent to remove, together with the resist pattern, parts of the metal laminated film on the resist pattern by a lift-off technique. The remaining part of the metal laminated film forms the gate electrode 31.

Next, the interlayer insulating film 42 and the upper insulating film 43 are formed on the lower insulating film 41 and the gate electrode 31. More specifically, a solution including silica is applied by spin-coating to the lower insulating film 41 and the gate electrode 31, and the solution is dried by, for example, heating to form a porous silica film used as the interlayer insulating film 42. The porous silica film or the interlayer insulating film 42 formed as described above has a porosity of about 40% and a relative permittivity of about 2.25. Then, the upper insulating film 43 is formed by depositing, for example, SiN on the interlayer insulating film 42 by CVD.

Figure 14B:
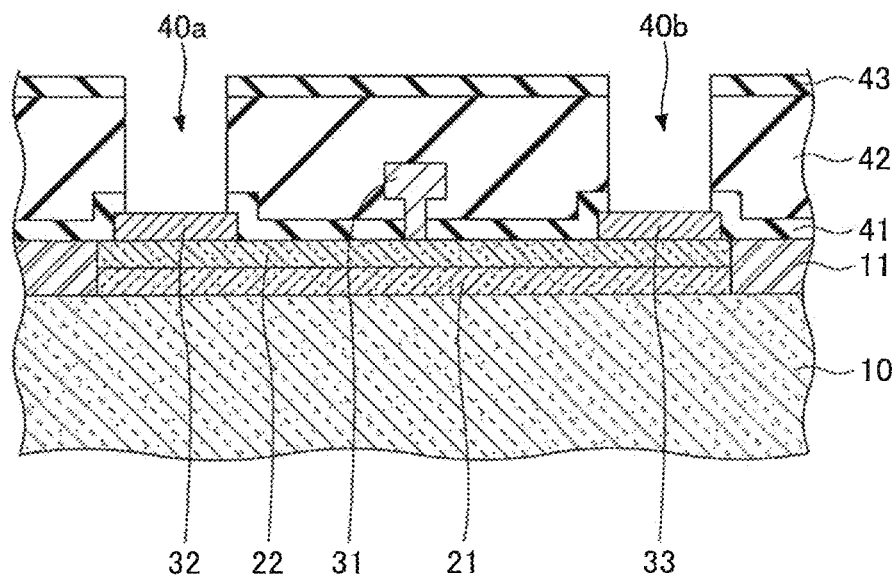

Next, as illustrated by FIG. 14B, parts of the upper insulating film 43, the interlayer insulating film 42, and the lower insulating film 41 in areas corresponding to the source electrode 32 and the drain electrode 33 are removed to form an opening 40a and an opening 40b. As a result, the opening 40a is formed in the area where the source electrode 32 is formed, and the opening 40b is formed in the area where the drain electrode 33 is formed. More specifically, a photoresist is applied to the upper insulating film 43, and the photoresist is exposed and developed by an exposure apparatus to form a resist pattern (not shown) having openings in areas where the openings 40a and 40b are to be formed. Next, parts of the upper insulating film 43, the interlayer insulating film 42, and the lower insulating film 41 in the openings of the resist pattern are removed by dry etching using a fluorine gas as an etching gas, to form the openings 40a and 40b.

As a result, a surface of the source electrode 32 is exposed in the opening 40a, and a surface of the drain electrode 33 is exposed in the opening 40b. At this stage, as illustrated by FIG. 5, Si—F and Si—OH generated by the etching gas adhere to the side surfaces of the openings 40a and 40b. FIG. 5 is an enlarged view of an area in FIG. 14B where the opening 40a is formed. The opening 40b is in a similar condition.

Next, heated wafer vapor (or steam) is supplied to hydrolyze Si—F adhering to the side surfaces of the openings 40a and 40b. More specifically, steam with a temperature of 250° C. is supplied to cause a reaction indicated by Formula (1) below. As a result, Si—F adhering to the side surfaces of the openings 40a and 40b is hydrolyzed by the steam, and Si—OH and HF are generated.

  (1)

That is, when Si—F is hydrolyzed, Si—OH and HF are generated as indicated by Formula (1); and Si—F adhering to the side surface of the opening 40a substantially disappears and the amount of Si—OH increases as illustrated by FIG. 6. The same applies to the side surface of the opening 40b. The hydrolysis proceeds smoothly when the temperature of steam is greater than or equal to 200° C., but does not proceed or proceeds very slowly when the temperature of steam is less than 200° C. Therefore, using steam with a temperature less than 200° C. is not preferable. Also, using steam with an extremely-high temperature that is greater than, for example, 600° C. is not preferable because such high-temperature steam may adversely affect nitride semiconductors and electrodes. Accordingly, the temperature of steam used for steam treatment in the present embodiment is preferably greater than or equal to 200° C. and less than or equal to 600° C.

Figure 15A:
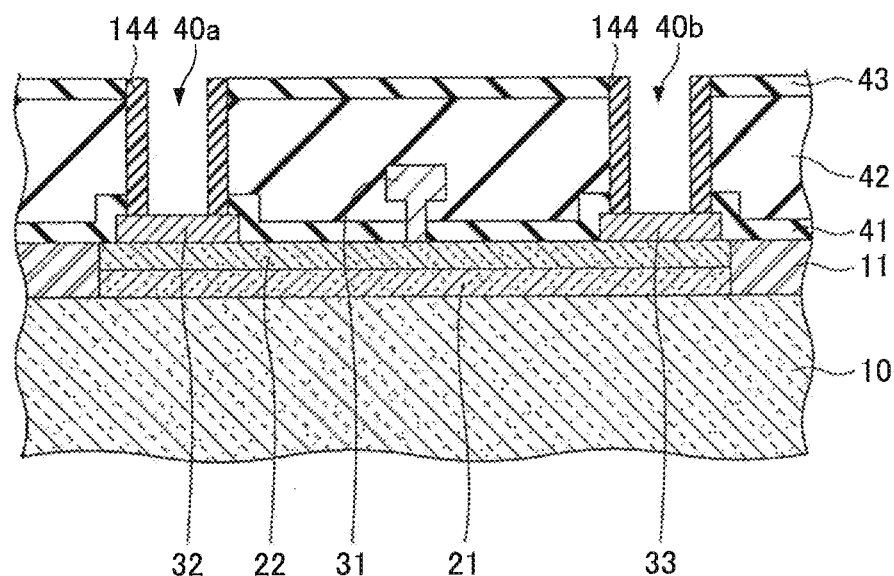
FIGS. 15A and 15B are drawings used to describe a method of producing a semiconductor device according to the second embodiment.

Next, as illustrated by FIG. 15A, a solution including aminopropyltriacetoxysilane is applied by spin coating to the side surfaces of the lower insulating film 41, the interlayer insulating film 42, and the upper insulating film 43 forming the side surfaces of the openings 40a and 40b, and the solution is illuminated by ultraviolet rays to form a hydrophobic film 144 made of a polymerized film including SiN. As a result, the side surfaces of the insulating films including the interlayer insulating film 42, which form the side surfaces of the openings 40a and 40b, are covered by the hydrophobic film 144. FIG. 7 is an enlarged view of an area in FIG. 15A where the opening 40a is formed. Any solution including a silicon compound indicated by Structural Formula (2) below may be used to form the hydrophobic film 144. Also, a polymerized film used as the hydrophobic film 144 may be formed by applying a solution including the silicon compound indicated by Structural Formula (2) and heating the applied solution to cause polymerization.

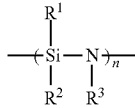

Structural Formula (2)

In Structural Formula (2), one or two of $R^1$, $R^2$, and $R^3$ are hydrogen atoms; each of the rest of $R^1$, $R^2$, and $R^3$ is one of a hydrogen atom, a substituted or unsubstituted alkyl group, a substituted or unsubstituted alkenyl group, a substituted or unsubstituted cycloalkyl group, and a substituted or unsubstituted aryl group; and "n" is an integer greater than or equal to 2. $R^1$, $R^2$, and $R^3$ may be the same component or different components.

Figure 15B:
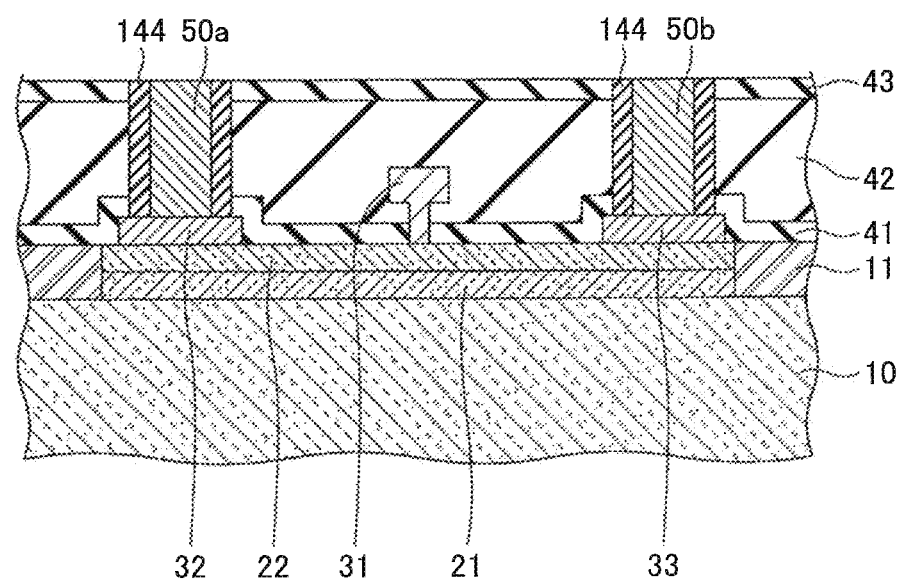

Next, as illustrated by FIG. 15B, the openings 40a and 40b are filled with a metal material to form through electrodes 50a and 50b. For example, the through electrodes 50a and 50b are formed by filling the openings 40a and 40b with a metal material by CVD or plating. Also, parts of the through electrodes 50a and 50b may be formed with a metal nitride such as TiN.

After the through electrodes 50a and 50b are formed, a plated layer is formed with a metal material on each of the through electrodes 50a and 50b. Then, steps described with reference to FIGS. 14A through 15B are repeated to produce a semiconductor device having a multilayer wiring structure. In the present embodiment, two stacks (or sets) of the lower insulating film 41, the interlayer insulating film 42, and the upper insulating film 43 are formed.

Figure 16A:
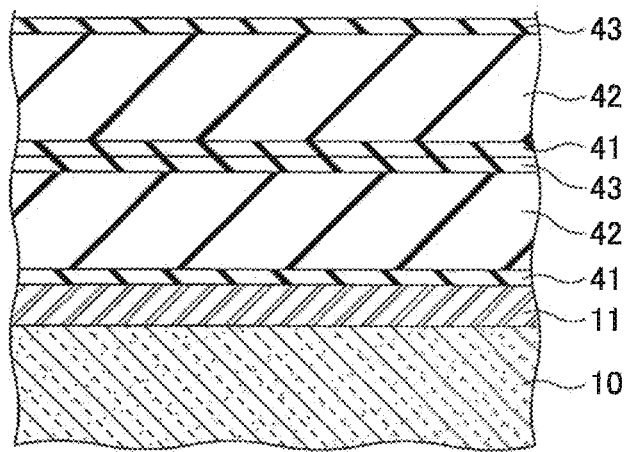
FIGS. 16A and 16B are drawings used to describe a method of producing a semiconductor device according to the second embodiment.
Figure 16B:
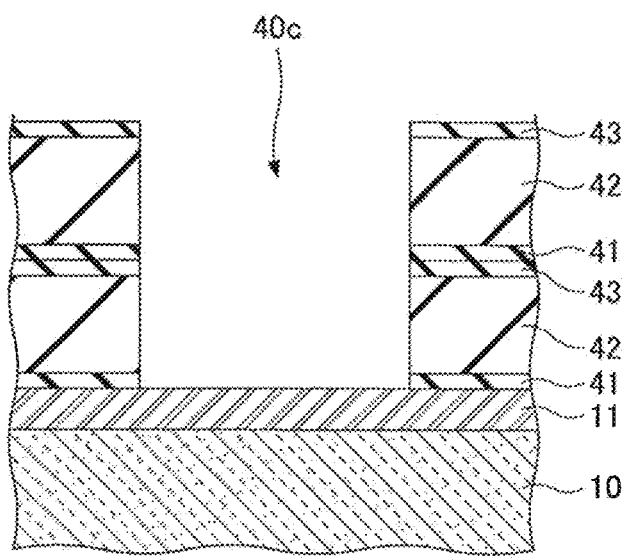

Next, as illustrated by FIGS. 16A and 16B, an opening 40c used as a scribe line is formed through the lower insulating films 41, the interlayer insulating films 42, and the upper insulating films 43 formed on the substrate 10. Here, in the area where the opening 40c is formed, the device isolation, area 11 is formed on the substrate 10, and the insulating films including the two layers of the interlayer insulating films 42 are formed on the device isolation area 11. More specifically, a first stack of the lower insulating film 41, the interlayer insulating film 42, and the upper insulating film 43 and a second stack of the lower insulating film 41, the interlayer insulating film 42, and the upper insulating film 43 are formed on the device isolation area 11 formed on the substrate 10. Accordingly, the opening 40c is formed by removing the first stack of the lower insulating film 41, the interlayer insulating film 42, and the upper insulating trim 43 and the second stack of the lower insulating film 41, the interlayer insulating film 42, and the upper insulating film 43 from an area where the scribe line is to be formed. The opening 40c may be formed by dry etching using a fluorine gas.

Next, heated water vapor (or steam) is supplied to hydrolyze Si—F adhering to the side surfaces of the opening 40c. When the opening 40c is formed by dry etching, Si—F and Si—OH generated by an etching gas adhere to the side surfaces of the opening 40c. Steam with a temperature of 250° C. is supplied to cause a reaction indicated by Formula (1) above. As a result, Si—F adhering to the side surfaces of the opening 40c is hydrolyzed by the steam, and Si—OH and HF are generated.

Figure 17:
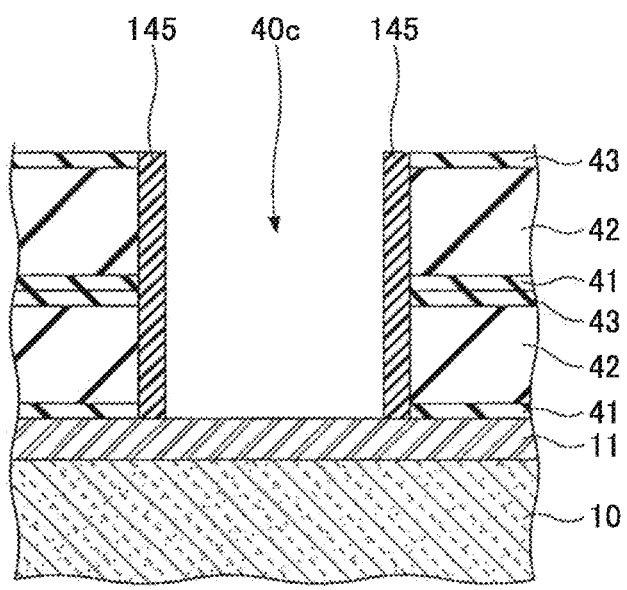
FIG. 17 is a drawing used to describe a method of producing a semiconductor device according to the second embodiment.

Next, as illustrated by FIG. 17, a solution including aminopropyltriacetoxysilane is applied by spin coating to the side surfaces of the lower insulating film 41, the interlayer insulating film 42, and the upper insulating film 43 forming the side surfaces of the opening 40c, and the solution is illuminated by ultraviolet rays to form a hydrophobic film 145 made of a polymerized film including SiN. Any solution including a silicon compound indicated by Structural Formula (2) above may be used to form the hydrophobic film 145. Also, a polymerized film used as the hydrophobic film 145 may be formed by applying a solution including the silicon compound indicated by Structural Formula (2) and heating the applied solution to cause polymerization.

Through the above process, a semiconductor device of the present embodiment is produced. According to the present embodiment, hydrophobic films 144 are formed on the side surfaces of the openings 40a and 40b formed in the insulating films including the interlayer insulating film 42. This configuration makes it possible to prevent moisture from entering through the side surfaces of the openings 40a and 40b formed in the insulating films including the interlayer insulating film 42. Also according to the present embodiment, the hydrophobic film 145 is formed on the side surfaces of the opening 40c (which is used as a scribe line) formed in the insulating films including the interlayer insulating film 42. This configuration makes it possible to prevent moisture from entering through the side surfaces of the opening 40c formed in the insulating films including the interlayer insulating film 42. Thus, the present embodiment makes it possible to prevent entrance of moisture into the interlayer insulating film 42 and thereby makes it possible to improve the reliability and life of a semiconductor device.

Configurations and methods not described above are substantially the same as those of the first embodiment.

A semiconductor device and a method for producing the semiconductor device according to the embodiments are described above. However, the present invention is not limited to the specifically disclosed embodiments, and variations and modifications may be made without departing from the scope of the present invention.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, if should be understood that the various changes, substitutions, and alterations could be made hereto without departing from the spirit and scope of the invention.

What is claimed is:

1. A semiconductor device, comprising:
a semiconductor layer formed on a substrate;
an insulating film formed on the substrate and the semiconductor layer;
an opening formed in the insulating film; and
a hydrophobic film formed on a side surface of the insulating film defining the opening, wherein
a contact angle of water on the hydrophobic film is greater than or equal to 90°; and
the hydrophobic film includes a silicon compound that is indicated by a structural formula below, where each of R1 and R2 is one of a hydrogen atom, a substituted or unsubstituted alkyl group, a substituted or unsubstituted alkenyl group, a substituted or unsubstituted cycloalkyl group, and a substituted or unsubstituted aryl group; and "n" is an integer greater than or equal to 2:

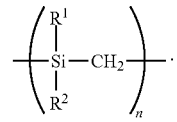

2. The semiconductor device as claimed in claim 1, further comprising:
a through electrode formed in the opening,
wherein the insulating film includes a plurality of layers of insulating films.

3. The semiconductor device as claimed in claim 1, wherein the opening implements a scribe line.

4. The semiconductor device as claimed in claim 1, wherein the insulating film includes porous silica.

* * * * *